(12) United States Patent
Coronel et al.

(10) Patent No.: US 7,804,134 B2
(45) Date of Patent: Sep. 28, 2010

(54) MOSFET ON SOI DEVICE

(75) Inventors: Philippe Coronel, Barraux (FR); Claire Fenouillet-Beranger, Grenoble (FR)

(73) Assignees: STMicroelectronics (Crolles 2) SAS, Crolles (FR); Commissariat a l'Energie Atomique, Paris (FR)

( * ) Notice: Subject to any disclaimer, the term of this patent is extended or adjusted under 35 U.S.C. 154(b) by 324 days.

(21) Appl. No.: 12/016,760

(22) Filed: Jan. 18, 2008

(65) Prior Publication Data

US 2008/0173944 A1 Jul. 24, 2008

(30) Foreign Application Priority Data

Jan. 19, 2007 (FR) ................................. 07 52776

(51) Int. Cl.
*H01L 21/782* (2006.01)
*H01L 21/84* (2006.01)
*H01L 27/12* (2006.01)

(52) U.S. Cl. ........................ 257/351; 257/244; 257/350; 257/355; 257/466; 257/686; 257/E21.61; 257/E21.611; 257/E21.7; 257/E23.085; 257/E25.006; 257/E25.013; 257/E27.112; 438/149; 438/153; 438/155; 438/238; 438/239

(58) Field of Classification Search ................. 257/244, 257/350, 351, 355, 466, 686, E21.61, E21.611, 257/E21.7, E23.085, E25.006, E25.013, E27.112; 438/149, 153, 155, 238, 239, 275; *H01L 21/782, H01L 21/84, 27/12*
See application file for complete search history.

(56) References Cited

U.S. PATENT DOCUMENTS

| 7,034,362 | B2 | 4/2006 | Rim ........................... 257/351 |
| 7,102,166 | B1 | 9/2006 | Bryant et al. ................. 257/64 |
| 2002/0063286 | A1 | 5/2002 | Wu et al. ..................... 257/347 |
| 2002/0175378 | A1* | 11/2002 | Choe et al. .................. 257/355 |
| 2005/0082531 | A1 | 4/2005 | Rim ............................. 257/72 |
| 2007/0228478 | A1* | 10/2007 | Mikasa ........................ 257/368 |
| 2009/0079000 | A1* | 3/2009 | Yamazaki et al. ........... 257/351 |
| 2010/0059822 | A1* | 3/2010 | Pinguet et al. .............. 257/351 |

OTHER PUBLICATIONS

Yang et al., Back-Gated CMOS on SOIAS For Dynamic Threshold Voltage Control, IEEE Transactions on Electron Devices, vol. 44, No. 5, May 1997.

Yang et al., High Performance CMOS Fabricated on Hybrid Substrate with Different Crystal Orientations, Electron Devices Meeting 2003 Technical Digest, IEEE 2003.

(Continued)

*Primary Examiner*—Dao H Nguyen
(74) *Attorney, Agent, or Firm*—Lisa K. Jorgenson; Allen, Dyer, Doppelt, Milbrath & Gilchrist, P.A.

(57) ABSTRACT

A MOSFET on SOI device includes an upper region having at least one first MOSFET type semi-conductor device formed on a first semi-conductor layer stacked on a first dielectric layer, a first conductive layer and a first portion of a second semi-conductor layer. A lower region includes at least one second MOSFET type semi-conductor device formed on a second portion of the second semi-conductor layer, a gate of the second semi-conductor device being formed by at least one conductive portion. The second semi-conductor layer is arranged on a second dielectric layer stacked on a second conductive layer.

22 Claims, 6 Drawing Sheets

OTHER PUBLICATIONS

Yang et al., On the Integration of CMOS with Hybrid Crystal Orientations, 2004 Symposium on VLSI Technology Digest of Technical Papers, Jun. 15-17, 2004.

Lim et al., 65nm High Performance SRAM Technology with $25F^2$, $0.16um^2 S^3$ (Stacked Single-crystal Si) SRAM Cell, and Stacked Peripheral SSTFT for Ultra High Density and High Speed Applications, Proceedings of ESSDERC, Grenoble France, 2005.

Rim at al., Fabrication and Mobility Characteristics of Ultra-Thin Strained Si Directly on Insulator (SSDOI) MOSFETs, Electron Devices Meeting, 2003, IEDM apos. 03 Technical Digest, IEEE International Volumne, Issue, Dec. 8-10, 2003.

Åberg et al., Electron and Hole Mobility Enhancements in Sub-100 nm-thick Strained Silicon Directly on Insulator Fabricated by a Bond and Etch-back Technique, 2004 Symposium on VLSI Technology Digest of Technical Papers.

Ito et al., Mechanical Stress Effect of Etch-Stop Nitride and its Impact on Deep Submicron Transistor Design, Electron Devices Meeting, 2000, IEDM Technical Digest.

Krivokapič et al., Locally Strained Ultra-Thin Channel 25nm Narrow FDSOI Devices with Metal Gate and Mesa Isolation, Electron Devices Meeting, 2003, IEDM '03 Technical Digest, IEEE International, Dec. 8-10, 2003.

Das et al., Analysis and Design of Digital CMOS Circuits in Hybrid SOI-Epitaxial Technology with Different Crystal Orientations, 2004 IEEE international SOI Conference, Charleston, SC, Oct. 4-7, 2004.

Fenouillet-Beranger et al., Requirements for Ultra-Thin-Film Devices and New Materials on CMOS Roadmap, SOI Conference, IEEE International, Sep. 29-Oct. 2, 2003.

\* cited by examiner

MOSFET ON SOI DEVICE

FIELD OF THE INVENTION

The present invention concerns the fabrication of a MOSFET (Metal-Oxide Semiconductor Field-Effect Transistor) on an SOI (Silicon On Insulator) device.

BACKGROUND OF THE INVENTION

In order to meet the forecasts of the ITRS (International Technology Roadmap for Semiconductors) for future generations of transistors, it is helpful to change the architecture of MOSFET.

The ITRS states that an increase in the mobility of carriers in the channel of transistors is becoming helpful to maintain the gain in performance for generations of transistors for which the gate lengths are less than 100 nm.

To do this, it is, for example, possible to use substrates based on strained silicon. It is also possible to use modules, or internal layers in the devices, which, through their intrinsic stress, place the transistor in tension or in compression.

The documents "High Performance CMOS Fabricated on Hybrid Substrate With Different Crystal Orientations" of M. Yang et al., Electron Devices Meeting 2003 Technical Digest, IEEE International, December 2003, pages 18.7.1 to 18.7.4, and "On the Integration of CMOS with Hybrid Crystal Orientations", of M. Yang et al., 2004 Symposium on VLSI Technology, Digest of Technical Papers, June 2004, pages 160 to 161, disclose a device formed on a silicon substrate with hybrid crystalline orientations. The device comprises an NMOS transistor formed on a part of a substrate, the crystalline orientation of which is (100) and a PMOS transistor on a part of the substrate, the crystalline orientation of which is (110). The part of the substrate on which one of the two transistors is formed is of an SOI type. The other part of the substrate on which the other of the two transistors is formed is of a bulk type. This type of structure also enables the mobility of carriers in the channel of the transistors to be increased. This type of device may have, in particular, the disadvantage that the two transistors have very different properties and operation. In addition, the advantage of a SOI substrate compared to a bulk type substrate may only be obtained for one of the two transistors. Finally, it may not be possible to have a back control, or "ground plane", for the transistor located on the SOI part, since this would affect the behavior of the transistor located on the bulk part of the substrate.

The document "Back-Gated CMOS on SOIAS for dynamic threshold voltage control" of I.Y. Yang et al., IEEE Trans. on Elec. Devices, vol. 44, no. 5, May 1997, pages 822 to 831, discloses a double gate type CMOS on SOI device with connection of the back gates, or controls. The thickness of the buried oxide is greater than 65 nm and that of the silicon is greater than 40 nm. The back controls are formed by implantation, which implies a doping of the channels of the CMOS device, which disrupts the operation of these channels (more complicated adjustment of threshold voltages may be helpful). The charges placed in the dielectric following the implantation may modify the electrostatic coupling effects, which may have an impact on the short channel effects of the CMOS device. In addition, the doped zones of the back controls extend uniquely underneath the active zones of the transistors, making the connection of the back controls complex.

The document "65 nm High Performance SRAM Technology with 25F$^2$, 0.16 µm$^2$ S$^3$ (Stacked Single-crystal Si) SRAM Cell, and Stacked Peripheral SSTFT for Ultra High Density and High Speed Applications" of Hoon Lim et al., Proceedings of ESSDERC, 2005, pages 549 to 552, discloses an architecture comprising MOS transistors stacked upon each other on three levels. This type of architecture enables a gain in the integration density of the transistors (less occupied space), but this gain implies a greater complexity of the method to fabricate such a structure (multiplication of photolithography steps necessary for forming the gates of the transistors). In addition, the stacked transistors of the SOI device may not be optimized since their buried oxide layer is thick and it may be difficult to improve the performance by a back control. The optimal crystalline orientation for this device may be achievable by bonding. Finally, the polycrystalline silicon deposited may helpfully be recrystallised, implying a long thermal budget at low temperature or several bonding steps, increasing the fabrication cost of this device.

SUMMARY OF THE INVENTION

There is therefore a need for a MOSFET device that enables good performance to be obtained in terms of flexibility so as to optimize the performance of NMOS and PMOS independently of each other, in dynamic operation of the circuit, conserving a good electrostatic control, in other words limiting the short channel effects on the threshold voltage, enabling a channel back control to be able to achieve multiple Vth, and being able to integrate semi-conductor devices of different types and also circuits with different functionalities on a same substrate.

To do this, one embodiment proposes a MOSFET on SOI device comprising an upper region including at least one first MOSFET type semi-conductor device arranged on a first semi-conductor layer stacked on a first insulating layer, a first portion of a first conductive layer and a first portion of a second semi-conductor layer. A lower region comprises at least one second MOSFET type semi-conductor device arranged on a second portion of the second semi-conductor layer, a gate of the second semi-conductor device being formed by at least one second portion of the first conductive layer. The second semi-conductor layer is arranged on a second insulating layer stacked on a second conductive layer.

Another embodiment concerns a MOSFET on SOI device comprising an upper region including at least one first MOSFET type semi-conductor device formed on a first semi-conductor layer stacked on a first dielectric, or insulating layer, a first conductive layer and a first portion of a second semi-conductor layer. A lower region comprises at least one second MOSFET type semi-conductor device formed on a second portion of the second semi-conductor layer, a gate of the second semi-conductor device being formed by at least one conductive portion. The second semi-conductor layer is arranged on a second dielectric, or insulating layer, stacked on a second conductive layer.

The first semi-conductor layer and the first dielectric layer can form a SOI substrate for the first semi-conductor device, the second portion of the second semi-conductor layer and the second dielectric layer being able to form another SOI substrate for the second semi-conductor device.

Thus, each of the semi-conductor devices may be formed on a different semi-conductor on insulator substrate, enabling each device and each substrate to have its specific characteristics. The MOSFET type semi-conductor devices are integrated on two different levels, resulting in a non stacked integration "in three dimensions", the semi-conductor devices not being superimposed one on top of the other.

One of the first or second MOSFET type semi-conductor devices may comprise a PMOS transistor and the other first or second semi-conductor MOSFET type devices may comprise a NMOS transistor.

In addition, the two semi-conductor devices may each have a back control, or "ground plane", formed respectively by the first conductive layer and the second conductive layer, or by the first portion of the first conductive layer and the second conductive layer when the gate of the second semi-conductor device is formed by a second portion of the first conductive layer, that may be integrated and contacted independently by means of an integration on two levels. The voltage applied to one and/or the other of the two back controls may be within a threshold of zero, or not if it is desired to achieve a back control of the semi-conductor devices. It is thereby possible to obtain devices with double independent gates.

In addition, the structure may further comprise a coupling, or connection, between the back controls of two semi-conductor devices, by forming, for example, an electrical coupling between the first conductive layer (or the first portion of the first conductive layer) and the second conductive layer, or by coupling the first conductive layer and the second conductive layer to a first electrical contact. The second conductive layer may also be coupled to a second electrical contact. This alternative is particularly interesting when these two devices are to be used to form SRAM, NAND or even NOR type circuits.

The first conductive layer, or the first portion of the first conductive layer, may be P-type when the first semi-conductor device comprises or is a NMOS transistor, or N-type when the first semi-conductor device comprises or is a PMOS transistor, or even of "midgap" type, in other words in which the output work is between around 4.17 eV and 5.1 eV, or between 4.55 eV and 4.65 eV. The second conductive layer may be P-type when the second semi-conductor device comprises or is a NMOS transistor or N-type when the second semi-conductor device comprises or is a PMOS transistor. This configuration also makes it possible to reduce the chance of a high degradation of the DIBL (Drain Inducted Barrier Lowering) of the transistor and the sub-threshold slope, when the gate length is reduced.

The thickness of the first dielectric layer and/or the second dielectric layer may be less than or equal to around 20 nm. Thus, the thin dielectric layer of a SOI substrate (or BOX for Buried Oxide) enables the formation of an efficient fully depleted MOSFET type device, the back control of this device limiting the extension of the space charge zone underneath the channel and thereby contributing to reducing the short channel effects, particularly in the case of a lightly doped or non doped channel, or when the gate of the MOSFET device is based on metal and/or is silicided. At low channel doping, the use of a back control enables a factor 2 gain on the DIBL of the transistor, in other words to have a DIBL reduced by around 100 mV compared to the DIBL of a transistor with low channel doping without back control. Preferably, the channels of the MOSFET type semi-conductor devices may be non doped.

The device may comprise at least one dielectric or insulating region laterally separating the upper region from the lower region. The first and/or the second semi-conductor layer may be based on silicon, and/or strained silicon, and/or silicon-germanium, and/or germanium, and/or any other type III-V material.

The semi-conductor of the first semi-conductor layer may have a crystalline orientation different to that of the semi-conductor of the second semi-conductor layer. For example, the semi-conductor of one of the first or the second semi-conductor layers may have a crystalline orientation equal to (100) and the semi-conductor of the other of the first or the second layer may have a crystalline orientation equal to (110).

These approaches therefore make it possible to fabricate NMOS and PMOS on SOI transistors with suitable different crystalline orientations, and fabricate NMOS and PMOS transistors or circuits with logic functions on a same level and to form other functions with different materials on another level. Moreover, these approaches make it possible to obtain, in terms of logical functions, horizontal and vertical integrations, to obtain transistors with multiple threshold voltages, by playing on the thicknesses of the dielectric layers of the SOI substrates, on the nature and the output work of the back controls that are going to modulate the threshold voltages of the PMOS and the NMOS, and to obtain NMOS and PMOS transistors with independent, or electrically connected, back controls.

The first conductive layer may be coupled to a first electrical contact, and the second conductive layer may be coupled to a second electrical contact independent of the first electrical contact. A gate of the first semi-conductor device may be based on a different material to that of the second conductive layer. A gate of the first semi-conductor device may be arranged on a portion of High-K dielectric, for example a dielectric in which the permittivity is greater than around 3.9, and the gate of the second semi-conductor device may be arranged on an oxide-nitride-oxide (also known as ONO stacking, formed by a layer of nitride arranged between two oxide layers) type stacking. The first dielectric layer may be arranged on a first portion of the first conductive layer, and the conductive portion may be formed by a second portion of the first conductive layer.

An aspect concerns a method of fabricating a MOSFET on SOI device, comprising at least the steps of:

a) fabricating a structure formed of a first semi-conductor layer stacked on a first insulating layer, a first conductive layer, a second semi-conductor layer, a second insulating layer and a second conductive layer, b) etching of a part of at least the first semi-conductor layer and the first insulating layer, laying bare a part of the first conductive layer and defining upper and lower regions of the MOSFET on SOI device, c) depositing a dielectric layer and a gate material on a non etched part of the first semi-conductor layer at the level of the upper part of the MOSFET on SOI device, d) etching of the gate material and the first conductive layer, forming the gates of a first and a second MOSFET type semi-conductor device respectively at the level of the upper and lower regions, e) forming first and second MOSFET type semi-conductor devices.

Another aspect concerns a method of fabricating a MOSFET on SOI device, comprising at least the steps of:

a) fabricating a structure formed of a first semi-conductor layer stacked on a first insulating or dielectric layer, a first conductive layer, a second semi-conductor layer, a second insulating or dielectric layer and a second conductive layer, b) etching of a part of at least the first semi-conductor layer and the first dielectric layer, laying bare a part of the first conductive layer and defining the upper and lower regions of the MOSFET on SOI device, c) depositing a dielectric layer and a gate material on a non etched part of the first semi-conductor layer at the level of the upper part of the MOSFET on SOI device, d) etching of the gate material, forming the gate of a first MOSFET type semi-conductor device at the level of the upper region, e) forming first and second MOSFET type semi-conductor devices, respectively at the level of the upper and lower regions.

The first conductive layer may also be etched during step d), and may form the gate of the second MOSFET type semi-conductor device at the level of the lower region.

The method may further comprise, between etching step b) and deposition step c), a step of etching of the part of the first conductive layer laid bare. The gate material may also be deposited, during step c), at the level of the lower region, and etched during step d) forming the gate of the second MOSFET type semi-conductor device at the level of the lower region.

The method may further comprise, after step e), a step of forming a first electrical contact coupled to the first conductive layer and a second electrical contact coupled to the second conductive layer, the two electrical contacts may be independent of each other.

In an alternative, the method may yet further comprise, after step e), a step of forming a first electrical contact coupled to the first conductive layer and to the second conductive layer, and a second electrical contact coupled to the second conductive layer. The method may also further comprise, after step e), a step of forming a dielectric or insulating region laterally separating the upper region from the lower region.

The electrical contacts coupled to the conductive layers forming the back controls of the semi-conductor devices are formed after the formation of the semi-conductor devices, once for the circuit or by using a STI (Shallow Trench Isolation) zone, the electrical contacts going through the STI zone without creating short circuits.

The carrying out of step a) may comprise the formation, by ion implantation and annealing, in the second semi-conductor based layer, of zones defining the portions of the second semi-conductor layer and may be etched selectively compared to the semi-conductor of the second layer, and may further comprise, after step d), a step of selective etching of these zones.

With this method, it is possible to form the gates of MOSFET type devices, for example based on materials different or not, by implementing a single step of gate lithography, unlike the methods of forming double gate devices of the prior art. The threshold voltages may also be adjusted by the use of the independent polarisation of the two regions of back control or by the doping or the output work of the back control.

A co-integration of partially depleted and fully depleted devices may be achieved without necessity of epitaxy or thinning of the semi-conductor layers.

According to the method described, it is possible to form a gate for the second MOSFET type semi-conductor device and a back control for the first MOSFET type semi-conductor device from a same conductive layer.

The implementation of step b) may further comprise the etching of the first conductive layer and the second semi-conductor layer.

BRIEF DESCRIPTION OF THE DRAWINGS

The present invention may best be understood by reference to the following description of embodiments provided as an indication only and in no way limitative and by referring to the accompanying drawings in which.

DETAILED DESCRIPTION OF THE PREFERRED EMBODIMENTS

In the description that follows, similar or equivalent parts of the various figures bear the same numerical references so as to simplify passing from one figure to the next. The various parts in the figures are not necessarily shown at a uniform scale in order to make the figures clearer. The different possibilities (alternatives and embodiments) should be understood as not being exclusive of each other and may be combined together.

Figure 1:
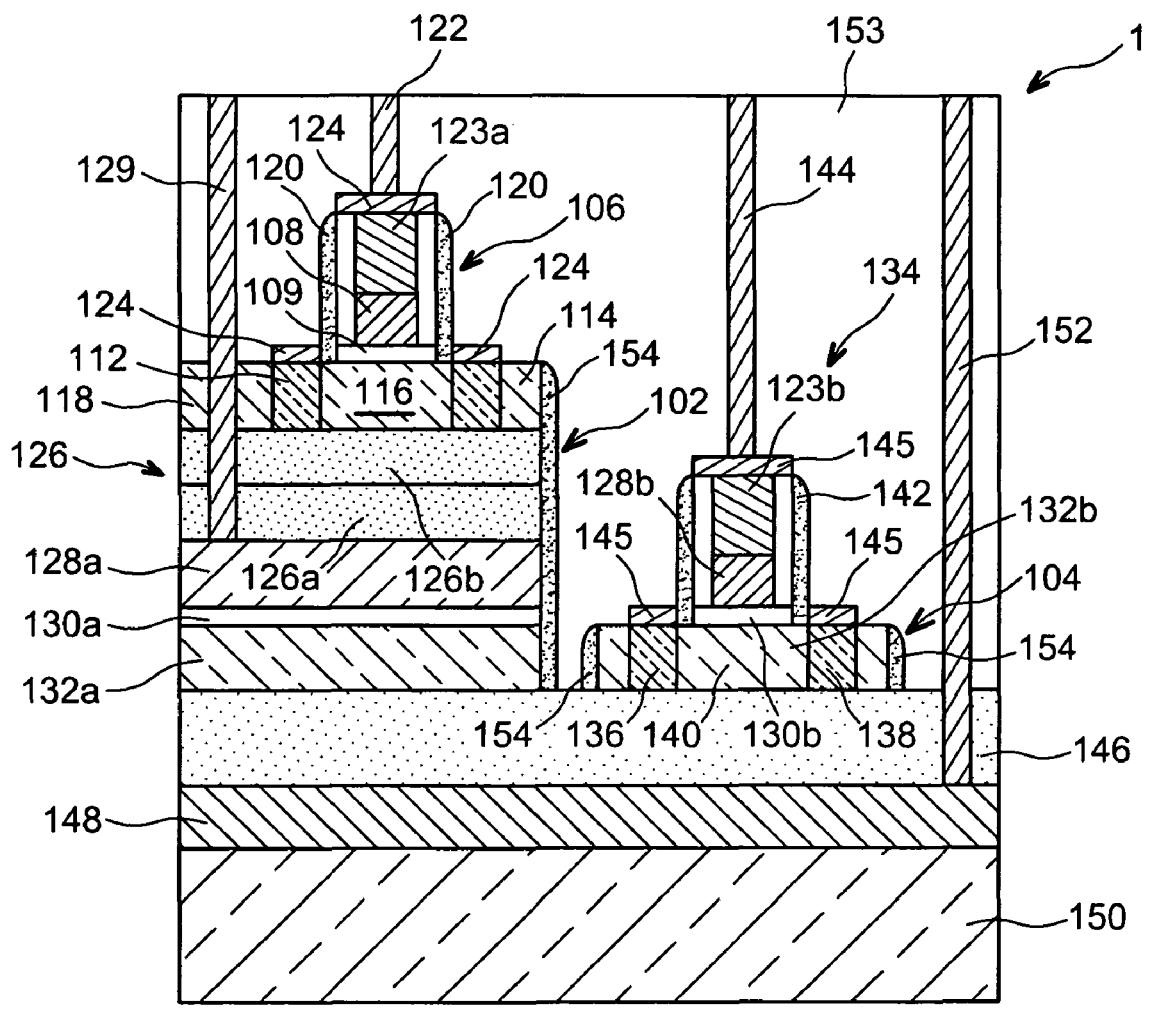
FIG. 1 shows a MOSFET on SOI device according to a specific embodiment of the present invention.

Reference is firstly made to FIG. 1, which represents a MOSFET on SOI device 1 according to a specific embodiment. This device 1 comprises two regions 102 and 104 each respectively comprising a MOSFET type semi-conductor device.

The upper region 102 comprises a PMOS type transistor 106 formed by a gate 108, a dielectric gate 109, source and drain zones, respectively 112, 114 and a channel 116 formed on a layer based on semi-conductor 118. Spacers 120 are also formed on the sides of the gate 108. The gate 108 is coupled to a gate contact 122, through which a control voltage is applied to the gate 108.

The gate 108 is based on metal, for example molybdenum and/or tungsten. In an alternative, the gate may be based on polysilicon. The dielectric layer 109 is based on a material preferably with high permittivity (High-K dielectric), in other words, of a dielectric constant greater than or equal to around 3.9, such as hafnium silicate or hafnium oxide, and of a thickness for example equal to around 3 nm. The semi-conductor layer 118 is, for example, a layer of silicon, of a thickness, for example, around 10 nm. A portion 123a of a layer of polysilicon is here arranged on the conductive gate 108, for example of a thickness between around 50 nm and 100 nm. In this embodiment, the gate 108 is also silicided by a layer of silicide 124 arranged on the portion of polysilicon 123a, also covering the source and drain zones 112, 114, for example based on nickel silicide or cobalt silicide, obtained by deposition of metal and annealing. This layer of silicide 124 enables the contact with the gate 108 and the source and drain zones 112, 114 to be improved by reducing the contact resistances. The layer 118 is here based on silicon of crystalline orientation (110), thereby enabling the mobility of the holes to be increased. The layer 118 may also be based on strained silicon, enabling the mobility of the carriers to be increased and thereby to increase the current performance of the transistor.

The layer of silicon 118 lies on a dielectric or insulating layer 126, for example based on silicon oxide. In this embodiment, the dielectric layer 126 is formed of two under-layers 126a, 126b bonded together by molecular bonding. The thickness of the dielectric layer 126 is for example around 20 nm. Typically, the dielectric layer 126 will have a thickness less than or equal to around 20 nm.

Thus, the layer of silicon 118 and the dielectric layer 126 form a SOI substrate for the PMOS 106. Given the 10 nm thickness of the layer of silicon 118 and the 20 nm thickness of the dielectric layer 126, the PMOS 106 is therefore here partially or fully depleted.

A portion 128a of a conductive layer 128, for example based on titanium nitride and of a thickness equal to around 10 nm, arranged underneath the dielectric layer 126, serves as back control to the PMOS 106, making it possible to act on the potential and the depletion in the channel 116, and to thereby modify the threshold voltage of the PMOS 106. This portion 128a is coupled to a conductive contact 129 through which a back control voltage is applied to the conductive portion 128a. The conductive layer 128 may also be formed based on tantalum carbide, or even based on polysilicon.

Finally, the portion 128a of conductive layer lies on a portion 130a of an oxide layer 130, for example based on a material preferably with high permittivity, in other words with dielectric constant greater than around 3.9, such as hafnium silicate or hafnium oxide and of a thickness equal to around 3 nm, and on a portion 132a of a semi-conductor layer 132, for example based on silicon, of a thickness equal to around 10 nm, and of crystalline orientation (100). It is also possible that the oxide layer 130 is replaced by an ONO stacking, in other words a layer of nitride arranged between two oxide layers. In an alternative of this embodiment, the layer of semi-conductor 118 may have a crystalline orientation (100) and the layer of semi-conductor 132 a crystalline orientation (110), thereby increasing the mobility of the holes and thereby the performance of the PMOS 106. But the crystalline orientations of these two layers 118, 132 based on semi-conductor may also be different to these two examples of crystalline orientation.

The lower region 104 comprises a MOS N-type transistor 134. The NMOS 134 comprises a gate 128b. This gate 128b is another portion of the conductive layer 128, in other words based on titanium nitride and of a thickness equal to around 10 nm. The NMOS 134 further comprises a gate dielectric formed in part by another portion 130b of the dielectric layer or the ONO stacking 130, source and drain zones, respectively 136 and 138, and a channel 140 formed in another portion 132b of the silicon layer 132. Given that the layer of silicon 132 is based on silicon of crystalline orientation (100), the mobility of the electrons is increased and therefore the current performance of the NMOS 134 transistor is improved.

Spacers 142 are also formed on the sides of the gate 128b, as well as spacers 154 enabling the semi-conductor based layers to be insulated.

The gate 128b is coupled to a gate contact 144, conveying the control voltage to the gate 128b. In this embodiment, the gate 128b is also covered with a portion 123b of a layer of polysilicon and silicided by a layer of silicide 145, also covering the source and drain zones 136, 138, for example based on nickel silicide or cobalt silicide, obtained by deposition of metal and annealed. This layer of silicide 145 enables the contact with the gate 128b and the source and drain zones 136, 138 to be improved by reducing the contact resistances. In an alternative, the gate of the NMOS 104 may further comprise, apart from the portion 128b of the conductive layer 128, a portion of the material forming the gate 108 arranged between the portion 128b of the conductive layer 128 and the portion of polysilicon 123b.

The lower 104 and upper 102 regions are arranged on a dielectric layer 146, for example, based on silicon oxide and of a thickness less than or equal to around 20 nm.

Thus, the portion 132b of the silicon layer 132 and the dielectric layer 146 form a SOI substrate for the NMOS 134. Due to the thicknesses of the layer of silicon 132 and the dielectric layer 146, the NMOS 134 here forms a fully depleted transistor, enabling the short channel effects to be better controlled. In addition, the channel 140 of the NMOS is here not doped, which makes it possible to work at a lower effective field and thereby to have a mobility not adversely affected by a channel doping, thereby increasing the performance of the devices.

The dielectric layer 146 is arranged on a conductive layer 148, for example based on titanium nitride and of a thickness equal to around 10 nm, itself arranged on a substrate 150 based on a semi-conductor such as silicon. This conductive layer 148 is coupled to a contact 152 enabling a back control of the NMOS 134 to be achieved.

The electrical contacts of back controls 129 and 152 are here independent of each other, the back control therefore being independent for the PMOS 106 and the NMOS 134. Finally, a layer of oxide 153 is deposited on the device 1, forming an overall insulation of the layers forming the device 1.

When the dielectric portion 109 is based on a High-K dielectric and the dielectric portion 130b is formed of an ONO stacking, the device 1 is particularly suited to forming a logic memory device.

In an alternative of the device 1 shown in FIG. 1, it is possible that the electrical contact 129 is coupled both to the portion 128a of the conductive layer 128 and to the second conductive layer 148 by extending through the portions 130b and 132a and the dielectric layer 146. Back controls coupled to each other are thereby achieved, which applies particularly to SRAM, NAND or NOR type circuits where the dependencies between the devices are useful for reducing the variability at the level of the back controls.

Figure 2A:
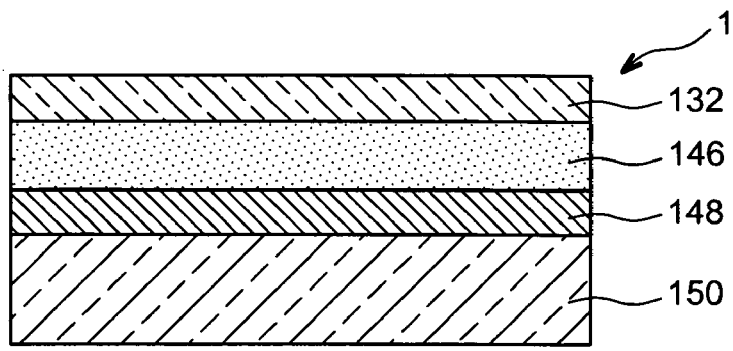
FIGS. 2A to 2F show the different steps of a method of fabricating a MOSFET on SOI device according to a first embodiment of the present invention.

A method of fabricating the MOSFET on SOI device 1 according to a first embodiment will now be described in reference to FIGS. 2A to 2F. As shown in FIG. 2A, a structure comprising the substrate 150 based on semi-conductor is firstly formed, on which is stacked the conductive layer 148, the dielectric layer 146 and the layer of silicon 132 of crystalline orientation (100).

Figure 2B:
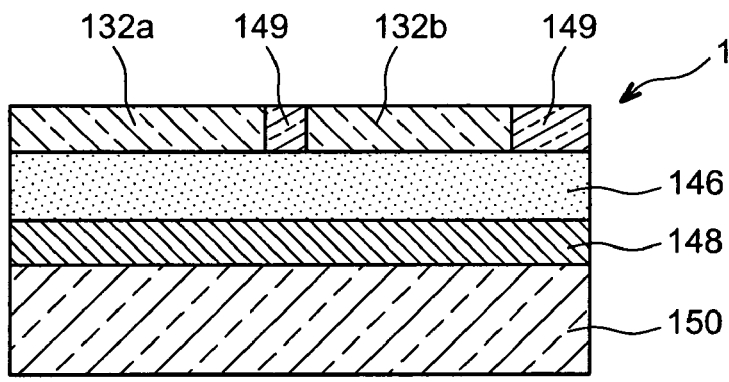

In the layer of silicon 132 zones 149 of silicon-germanium are then formed. These zones 149 are created by photolithography, then by implantation of germanium in the second layer of silicon 132 at the location of these zones 149. An annealing then transforms the silicon in which is implanted the germanium into silicon-germanium, forming the zones 149. In FIG. 2B, the layer of silicon 132 is thereby divided into two portions 132a and 132b, the zones 149 of silicon-germanium separating the portions 132a, 132b of silicon. In general, the zones 149 may also be formed from at least one material that can be removed selectively compared to the material of the layer 132, such as boron, phosphorous, aluminium, or oxide, for example by carrying out a VPD (vapour phase doping) to form the zones 149.

Figure 2C:
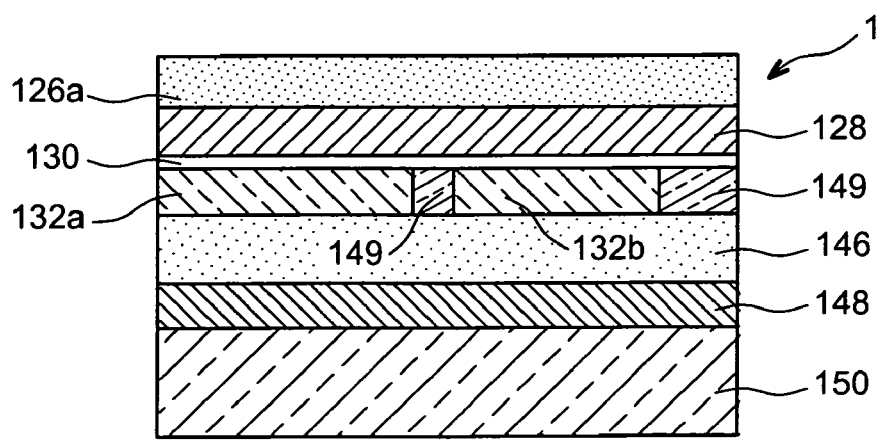

As shown in FIG. 2C, on the layer of silicon 132 is then deposited the dielectric layer 130, on which is deposited the conductive layer 128 and the dielectric under-layer 126a.

A molecular bonding is then carried out between the first structure formed previously and a second structure formed of a double SOI stacking comprising a first dielectric under-layer 126b, for example of a thickness equal to around 10 nm, the layer of silicon 118, a dielectric layer 156, for example based on silicon oxide and of a thickness equal to around 145 nm, and another layer of silicon 158, for example similar to the layer of silicon 150. The molecular bonding is carried out between the two under-layers 126a, 126b thereby forming a dielectric layer 126 of thickness equal to around 20 nm.

Figure 2D:
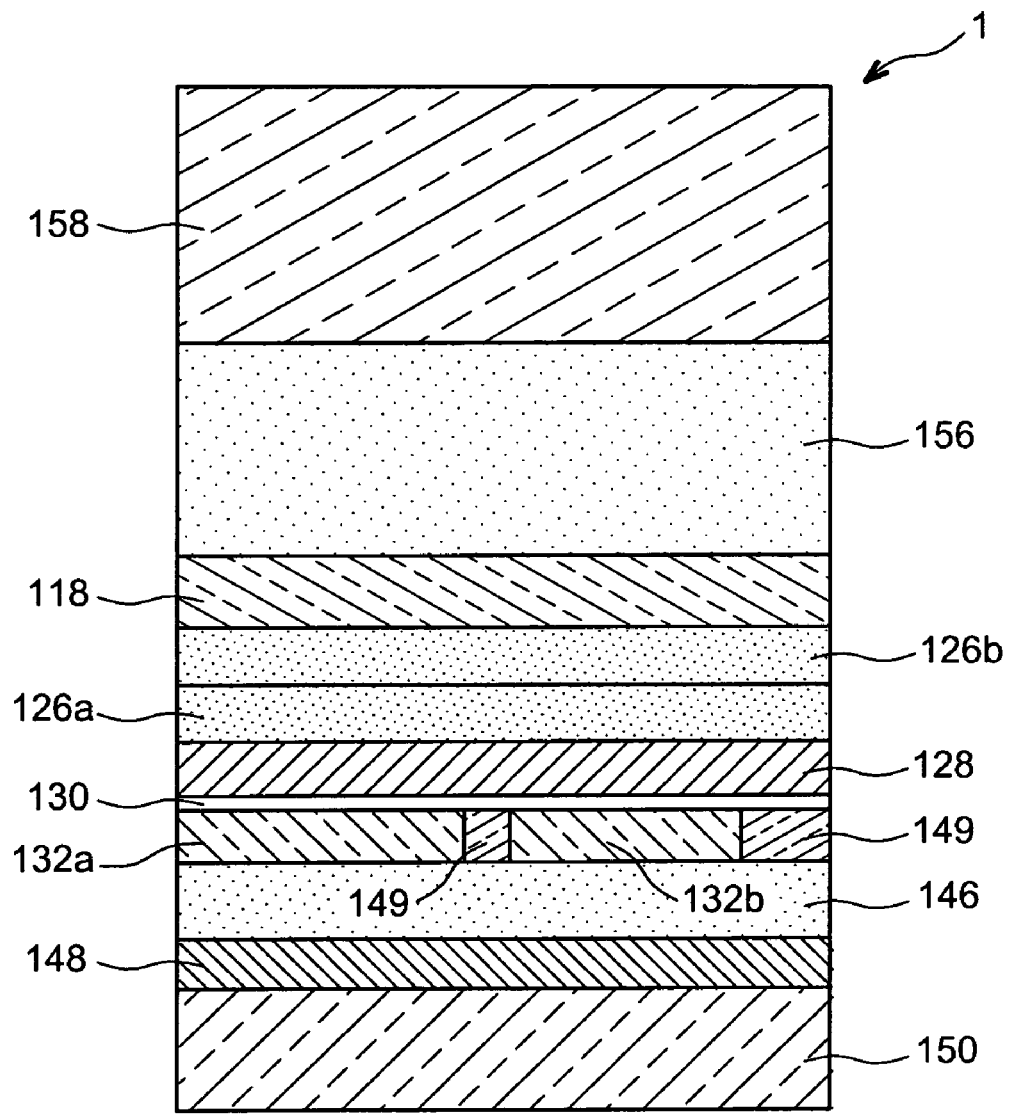
Figure 2E:
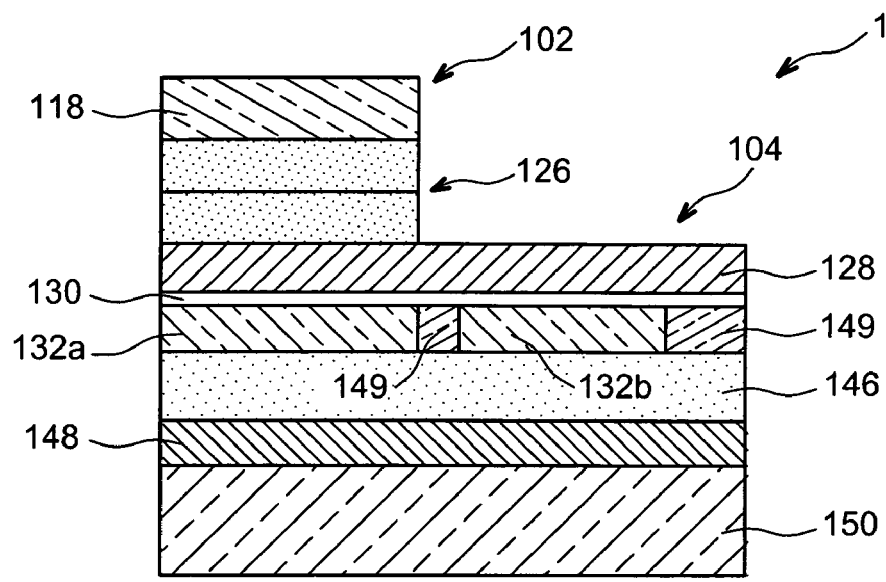

As shown in FIG. 2E, the layer of silicon 158 and the oxide layer 156 are removed, then a photolithography and an etching are carried out to define the active zones on which the NMOS and PMOS transistors may be formed. The etching is stopped at the level of the conductive layer 128. The upper 102 and lower 104 regions of the device 1 are thereby defined.

Figure 2F:
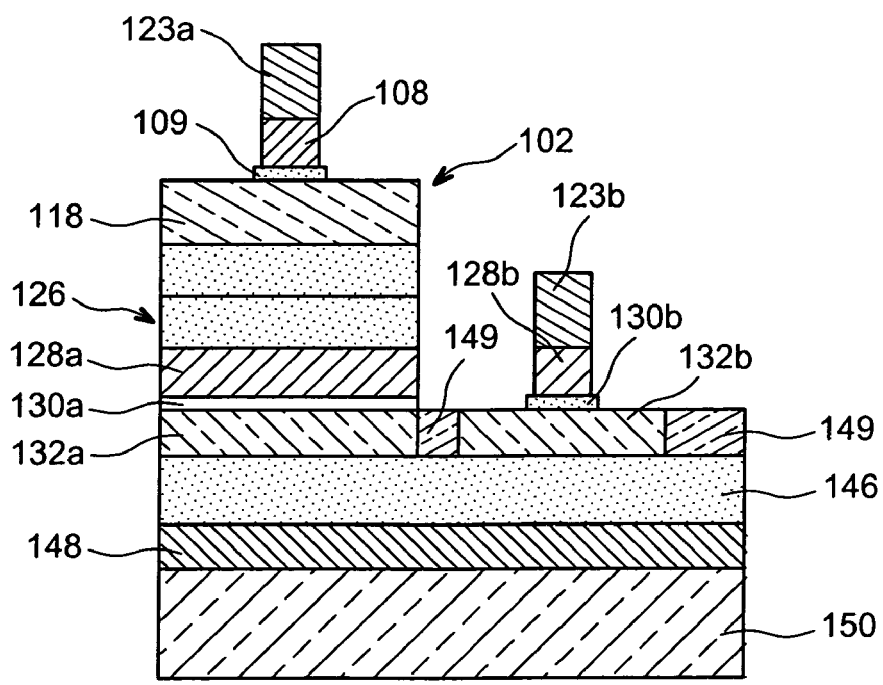

The deposition of the dielectric, conductive or polysilicon layer 109 is then carried out to form the gate 108 and a layer of polysilicon to form the portions 123a and 123b arranged on the gates 108 and 128b. A photolithography and an etching of the metal 108 and of the conductive layer 128, as well as the dielectric layers 109 and 130 and the layer of polysilicon make it possible to form the conductive gate 108 for the fabrication of the PMOS 106 and the conductive gate 128b of the NMOS 134 (FIG. 2F). In an alternative, it is possible to conserve a portion of the dielectric layer 109 on the conductive gate 128b. The materials of the gates 128b and 108 may be of the same nature or of different nature, thereby forming dual gates, enabling the threshold voltage to be adjusted for the NMOS 134 and the PMOS 106.

The source 112, 136 and drain 114, 138 zones are then formed in the silicon 118 and 132b. The zones 149 of silicon-germanium are then removed in a selective manner in relation to the silicon of the layer 132. An additional epitaxy may also be carried out in order to raise the source 112, 136 and drain 114, 138 zones, facilitating the subsequent formation of layers of silicide 124 and 145 on these source and drain zones. The spacers 120, 142 and 154 are then formed, insulating the gates and the upper 102 and lower 104 regions, and a layer of silicide 124 and 145 is formed on the portions of polysilicon 123a and 123b, as well as on the source and drain zones. The oxide layer 153 is then deposited on the device 1. Finally, the contacts 129, 122, 144 and 152, that are coupled to the gates 108 and 128b and to the back controls formed by the portion 128a of conductive layers for the PMOS 106 and by the conductive layer 148 for the NMOS 134, are formed by an etching in the oxide layer, deposition in these etchings of an insulating barrier, for example based on titanium nitride and/or tantalum nitride, then by deposition of a metal such as tungsten in the etchings formed (see FIG. 1).

In an alternative of the method described previously, it is possible during the etching step shown in FIG. 2E, to stop the etching on the dielectric layer 130, thereby removing the portion of the conductive layer 128 located at the level of the lower region 104. The gate material may then be deposited both at the level of the upper region 102 and at the level of the lower region 104. The step of photolithography and etching then carried out can thereby form the two gates 108 and 128b. The two gates are therefore here formed from a same layer of gate material.

Figure 3A:
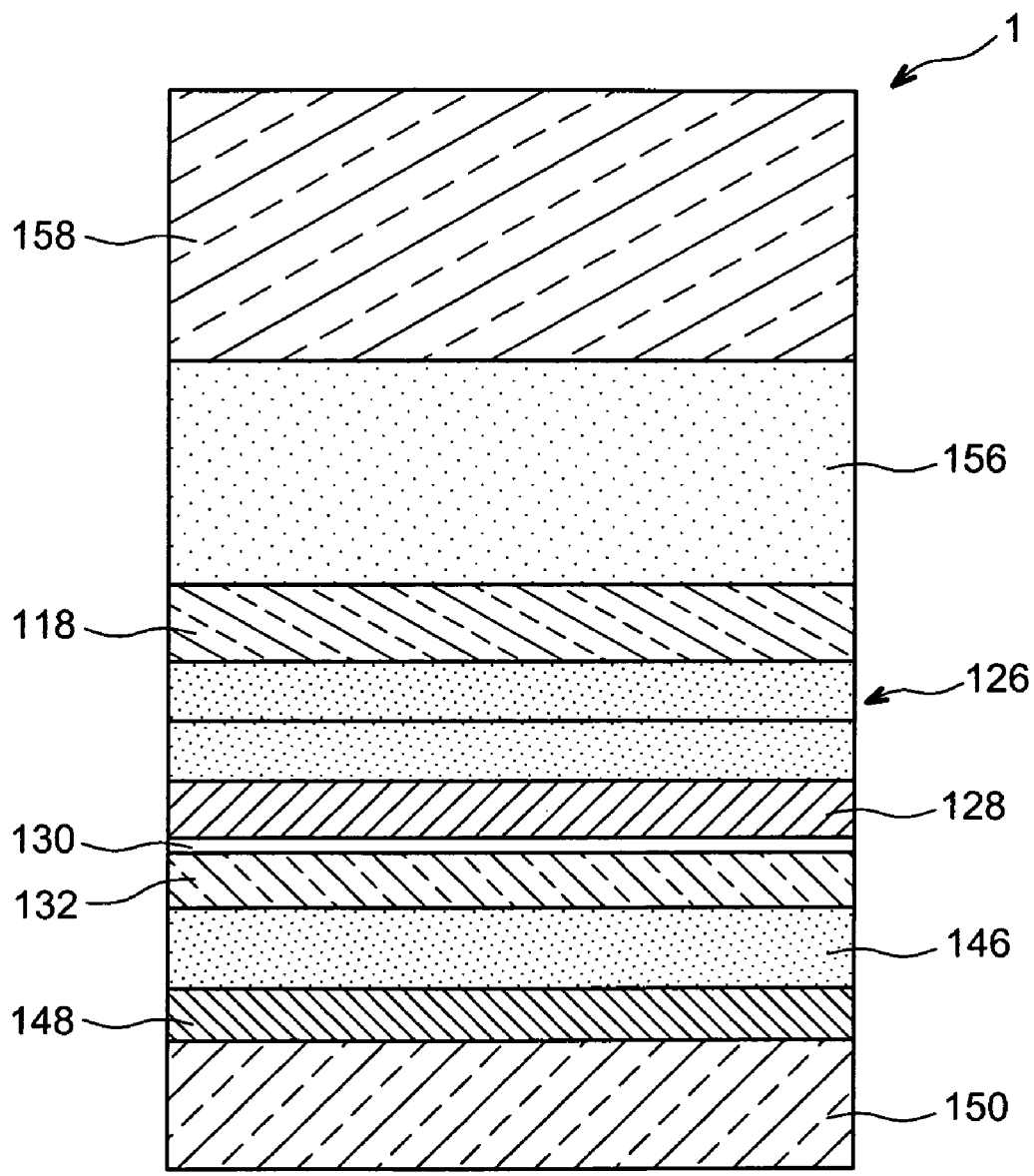
FIGS. 3A to 3B show the steps of a method of fabricating a MOSFET on SOI device according to a second embodiment of the present invention.
Figure 3B:
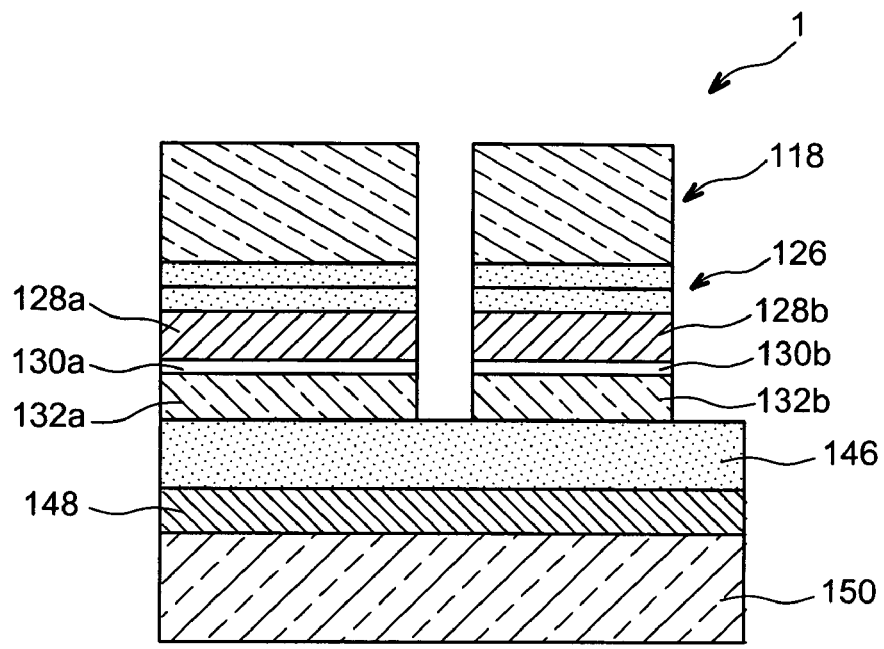

A method of fabricating the MOSFET on SOI device 1 according to a second embodiment will now be partially described in reference to FIGS. 3A and 3B. As shown in FIG. 3A, a stacking of layers comprising the same layers as the stacking shown in FIG. 2D is firstly carried out. Compared to the layer of silicon 132 of FIG. 2D, the layer of silicon 132 shown in FIG. 3A does not comprise the silicon-germanium 149 zones. This stacking of layers may, for example, be achieved by techniques similar to that used for achieving the stacking shown in FIG. 2D.

The layers 158 and 156 are firstly removed, then a photolithography and an etching of the layers 118, 126, 128, 130 and 132 is carried out, stopping at the dielectric layer 146, while separating these layers into portions forming the future upper 102 and lower 104 regions (FIG. 3B).

Then, the silicon 118 and the part of the dielectric layer 126 located at the level of the lower region 104 are removed. The dielectric 109 then the metal 108 of the gate of the PMOS 106 is then deposited. The etching of the gate 108 is then carried out. The method is then terminated as previously for the first embodiment as shown in FIG. 2F, ending up with the device 1 of FIG. 1.

Figure 4:
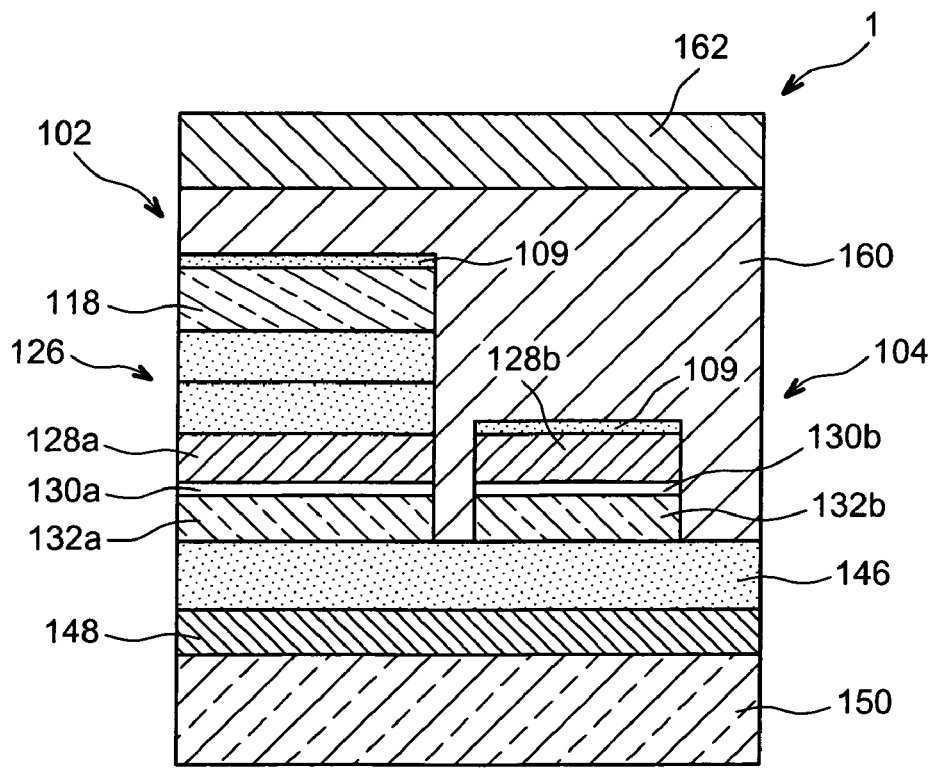
FIG. 4 shows a step of a method of fabricating a MOSFET on SOI device according to a third embodiment of the present invention.

A method of fabricating an MOSFET on SOI device 1 according to a third embodiment will now be partially described in reference to FIG. 4. A stacking of layers comprising the same layers as the stacking shown in FIG. 3A is firstly carried out. This stacking of layers may for example be carried out by techniques similar to those used for forming the stackings shown in FIGS. 2D and 3A.

The layers 158 and 156 are then removed, then a photolithography and an etching of the layers 118, 126, 128, 130 and 132 is carried out, stopping at the dielectric layer 146, by separating these layers into portions forming the future upper 102 and lower 104 regions, in a manner similar to FIG. 3B.

The portions of semi-conductor 118 and dielectric 126 layers are then removed at the level of the lower region 104. The dielectric layer 109 is then deposited on the remaining portion of the layer 118 located at the level of the upper portion 106 and on the portion 128b of the first conductive layer 128, then a layer of metal 160 and a layer of polysilicon 162 on all of the structure (FIG. 4).

Finally, an etching of the layer of polysilicon 162 and the conductive layer 160 is carried out so that a portion of the conductive 160 and polysilicon 162 layers remains at the level of a part of the dielectric layer 109 present at the level of the lower 104 and upper 106 zones. The device 1 is then finished in a manner similar to the device in the previously described embodiments.

The above description applies to all technology nodes for fabricating semi-conductor devices, and particularly technology nodes less than 100 nm.

The invention claimed is:

1. An electronic device comprising:
   an upper region comprising
      a first semiconductor layer and at least one first MOSFET device thereon, and
      a first dielectric layer, a first conductive layer, and a first portion of a second semiconductor layer arranged in stack relation and underlying said first semiconductor layer; and
   a lower region comprising
      at least one second MOSFET device on a second portion of the second semiconductor layer,
      said at least one second MOSFET device comprising a gate including at least one conductive portion, and
      a second dielectric layer and a second conductive layer arranged in stacked relation and underlying said second semiconductor layer.

2. An electronic device according to claim 1 wherein at least one of the first semiconductor layer and the second semiconductor layer comprises strained silicon.

3. An electronic device according to claim 1 wherein the first semiconductor layer has a different crystalline orientation than the second semiconductor layer.

4. An electronic device according to claim 1 wherein one of the first semiconductor layer and the second semiconductor layer has a crystalline orientation of (100); and wherein the other of the first semiconductor layer and the second semiconductor layer has a crystalline orientation of (110).

5. An electronic device according to claim 1 wherein one of the first MOSFET device and the second MOSFET device comprises a PMOS transistor; and wherein the other of the first MOSFET device and the second MOSFET device comprises a NMOS transistor.

6. An electronic device according to claim 1 wherein the first conductive layer comprises a P-type conductive layer; and wherein the first MOSFET device comprises a NMOS transistor.

7. An electronic device according to claim 1 wherein the first conductive layer comprises an N-type conductive layer; and wherein when the first semiconductor device comprises a PMOS transistor.

8. An electronic device according to claim 1 wherein the first conductive layer comprises a midgap type conductive layer.

9. An electronic device according to claim 1 wherein the second conductive layer comprises a P-type conductive layer; and wherein the second MOSFET device comprises an NMOS transistor.

10. An electronic device according to claim 1 wherein the second conductive layer comprises an N-type conductive layer; and wherein the second MOSFET device comprises a PMOS transistor.

11. An electronic device according to claim 1 wherein the first MOSFET semiconductor device comprises a gate; and wherein the gate of the first MOSFET device and the second conductive layer comprise different materials.

12. An electronic device according to claim 1 further comprising first and second electrical contacts; wherein the first conductive layer is coupled to the first electrical contact; and wherein the second conductive layer is coupled to the second electrical contact independent.

13. An electronic device according to claim 1 further comprising first and second electrical contacts; wherein the first conductive layer and the second conductive layer are each coupled to the first electrical contact; and wherein the second conductive layer is also coupled to the second electrical contact.

14. An electronic device according to claim 1 further comprising at least one dielectric region laterally separating the upper region from the lower region.

15. An electronic device according to claim 1 wherein a thickness of at least one of the first dielectric layer and the second dielectric layer is less than 25 nm.

16. An electronic device according to claim 1 wherein the first semiconductor device comprises a gate arranged on a portion of High-K dielectric; and wherein the second semiconductor device comprises a gate arranged on an oxide-nitride-oxide type stacking.

17. An electronic device according to claim 1 wherein the first conductive layer comprises a first portion and a second portion; wherein the first dielectric layer is arranged on the first portion of the first conductive layer; and wherein the conductive portion is formed by the second portion of the first conductive layer.

18. An electronic device comprising:
an upper region comprising
a first semiconductor layer and at least one first MOSFET device comprising a PMOS transistor thereon, and
a first dielectric layer, a first conductive layer, and a first portion of a second semiconductor layer arranged in stack relation and underlying said first semiconductor layer, the second semiconductor layer having a different crystalline orientation than the first semiconductor layer; and
a lower region comprising
at least one second MOSFET device comprising an NMOS transistor on a second portion of the second semiconductor layer,
said at least one second MOSFET device comprising a gate including at least one conductive portion, and a second dielectric layer and a second conductive layer arranged in stacked relation and underlying said second semiconductor layer.

19. An electronic device according to claim 18 wherein at least one of the first semiconductor layer and the second semiconductor layer comprises strained silicon.

20. An electronic device according to claim 18 wherein the first MOSFET semiconductor device comprises a gate; and wherein the gate of the first MOSFET device and the second conductive layer comprise different materials.

21. An electronic device according to claim 18 further comprising first and second electrical contacts; wherein the first conductive layer is coupled to the first electrical contact; and wherein the second conductive layer is coupled to the second electrical contact independent.

22. An electronic device according to claim 18 further comprising first and second electrical contacts; wherein the first conductive layer and the second conductive layer are each coupled to the first electrical contact; and wherein the second conductive layer is also coupled to the second electrical contact.

* * * * *